United States Patent [19]
Voorhis et al.

[11] Patent Number: 4,709,560
[45] Date of Patent: Dec. 1, 1987

[54] CONTROL MODULE COOLING

[75] Inventors: Roger Voorhis, Liverpool; Daryl G. Erbs, Canastota; John M. Palmer, Syracuse; Derrick A. Marris, Blossvale, all of N.Y.

[73] Assignee: Carrier Corporation, Syracuse, N.Y.

[21] Appl. No.: 938,105

[22] Filed: Dec. 4, 1986

[51] Int. Cl.⁴ .......................................... F25B 39/04
[52] U.S. Cl. .................................. 62/508; 165/125; 361/384
[58] Field of Search .................. 62/507, 508, 428; 361/384; 174/16 R; 165/125

[56] References Cited

U.S. PATENT DOCUMENTS 4,504,030 3/1985 Kwiat et al. ................... 361/384 X

FOREIGN PATENT DOCUMENTS 0182042 10/1983 Japan ................................ 361/384

Primary Examiner—William E. Wayner
Attorney, Agent, or Firm—Dana F. Bigelow

[57] ABSTRACT

The control box for a refrigeration condensing unit has a heat sink mounted on its rear side between the control box and the coil assembly, the heat sink being in the flow path of the cooling air flowing in thru the coil such that the heat dissipation therefrom is substantially enhanced. The heat sink has a plurality of fins formed on its rear side, with the fins extending across the relatively narrow width of the heat sink such that the cooling air flows over the entire length of each of the fins and provides a substantially uniform velocity profile along the heat sink vertical axis.

7 Claims, 4 Drawing Figures

CONTROL MODULE COOLING

BACKGROUND OF THE INVENTION

This invention relates generally to control modules for air conditioning systems and, more particularly, to heat sink cooling of electronic components in a control module mounted to an outdoor coil apparatus.

As part of an outdoor, or condensor coil apparatus, it is generally necessary to have certain control elements for controlling the various included elements such as the compressor and fan motors. The control elements are generally packaged in a control box which is located on or near the outdoor coil assembly.

Heretofore, the control modules have primarily included mechanical and electro-mechanical devices. Since such devices generated relatively little heat, it was not necessary to make any provision for cooling of the various components since the required cooling effect occurred naturally by way of conduction and convection.

With the advent of solid state control devices and the use of such devices in air conditioning control modules, greater amounts of heat are generated within the control box. For example, in inverter controlled variable speed compressor applications, a plurality of relatively large transistors are used to perform the switching functions, thereby resulting in substantial amounts of heat being generated. In order to protect those components from damage, this heat must be dissipated.

A common method of cooling electronic components is that of using a heat sink to cause the heat to be conducted relatively quickly from the electronic components to the heat sink, which has a relatively large surface area that can be cooled rather quickly by convection. Such a heat sink must therefore be thermally connected to the electronic components while at the same time being exposed to the cooling medium such as the surrounding ambient air. The heat sink must therefore be incorporated into the control box in such a way as to achieve these purposes. At the same time, however, for purposes of manufacture, it is desirable to simplify the manner in which the heat sink is mounted to the control box. Accordingly, the applicants first choices were to mount the heat sink on the side of the control box or on the top portion thereof. The applicants discovered that in each of these locations the degree of heat dissipation to the ambient air was insufficient.

In order to enhance the heat dissipation from a heat sink, it has become common practice to provide a plurality of ribs or fins to thereby increase the surface area and the rate at which heat is transferred to the surrounding air. Because of the well known "chimney affect", it is common to mount a heat sink such that the fins are aligned vertically to thereby cause an enhanced flow of cooling air vertically upwardly across the surface thereof.

It is therefore an object of the present invention to provide, in an air conditioning system, a control box having electronic components therein and having improved heat dissipation characteristics.

Another object of the present invention is the provision in an air conditioning control box, a heat sink mounting arrangement which is simple in design and effective in dissipating the required amount of heat.

Yet another object of the present invention is the provision in an air conditioning control box having electronic components therein, for adequately dissipating the heat generated thereby.

Still another object of the present invention is the provision for cooling the electronic components of an air conditioning control box in an effective and economical manner.

These objects and other features and advantages become more readily apparent upon reference to the following description when taken in conjunction with the appended drawings.

SUMMARY OF THE INVENTION

Briefly, in accordance with one aspect of the invention, a heat sink is located between the control box and an outdoor coil structure having a fan therein, such that a portion of the cooling air being drawn in through the coil by way of the fan, first passes over the heat sink to thereby promote faster and more uniform cooling of the heat sink.

By another aspect of the invention, the heat sink is vertically located on the outdoor coil structure such that its location coincides with that area where the velocity of the incoming air to the coil is at a maximum. In this way, the amount of air flowing over the heat sink is optimized to thereby optimize the degree of heat transfer therefrom.

By yet another aspect of the invention, the heat sink is so situated between the control box and the outdoor coil structure that its cooling fins are generally horizontally disposed on the short axis of the heat sink. The applicants have discovered that the unrestricted entrances to the flow channels between adjacent fins, together with the use of shorter channel lengths causes an enhancement of the air flow over the heat sink and therefore an enhanced cooling thereof. Further, the velocity profile along the vertical axis of the heat sink was found to be substantially uniform. In other words, the aligning of the heat sink fins in a horizontal short-axis disposition next to the outdoor coil structure having a fan operating therein, results in a relatively uniform air flow velocity profile, at relatively high flow rates, over the surface of the heat sink to thereby enhance the heat dissipation therefrom.

In the drawings as hereinafter described, a preferred embodiment is depicted; however, various other modifications and alternate constructions can be made thereto without departing from the true spirit and scope of the invention.

BRIEF DESCRIPTION OF THE DRAWINGS

FIG. 3 is a sectional view thereof as seen along lines 3—3 of FIG. 2.

DESCRIPTION OF THE PREFERRED EMBODIMENT

Figure 1:
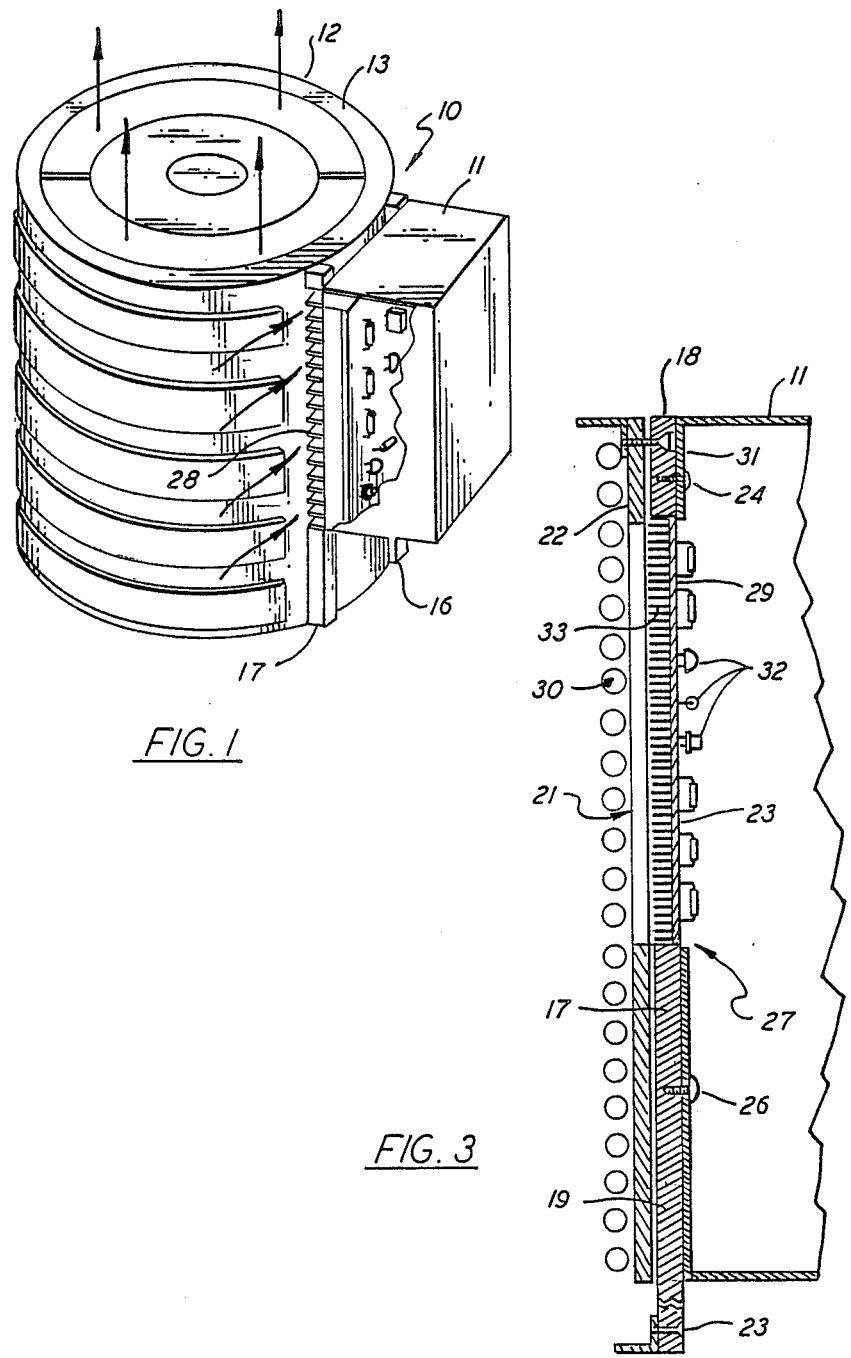
FIG. 1 is a perspective view of a condenser coil assembly with a control module attached thereto.
Figure 2:
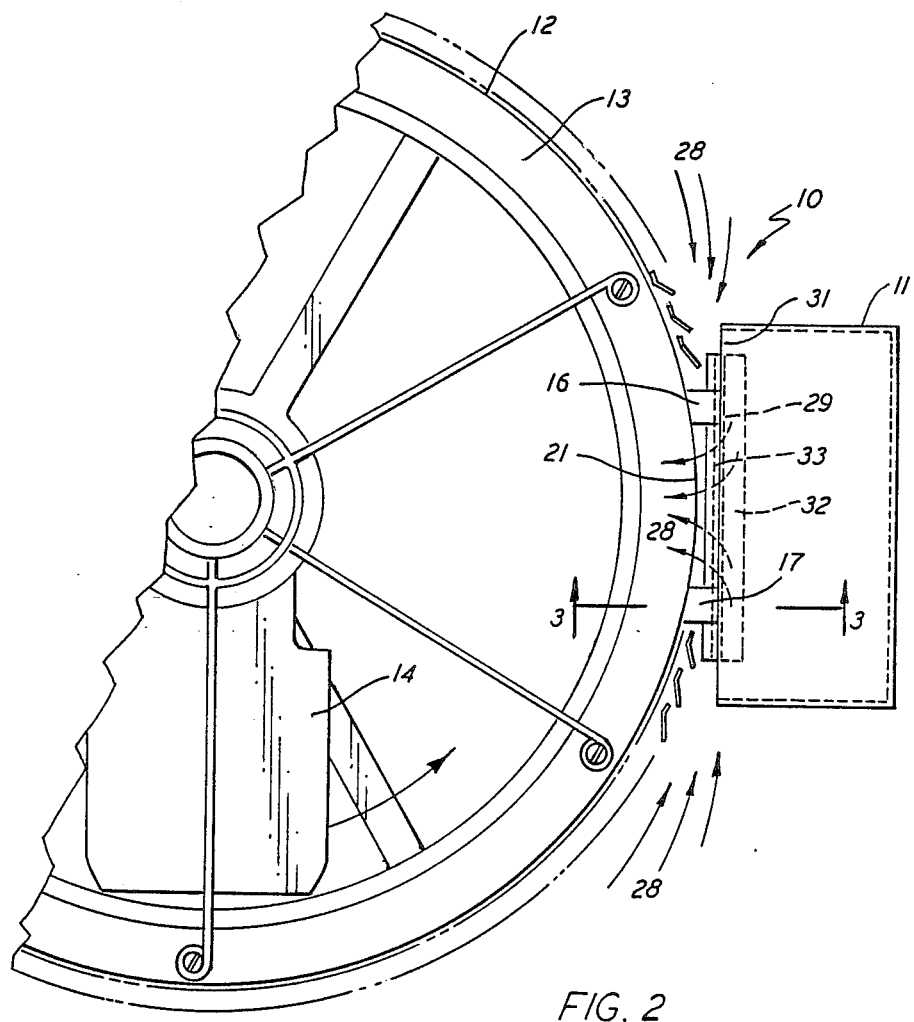
FIG. 2 is a partial top view thereof showing the heat sink in accordance with the present invention.

Referring now to FIGS. 1 and 2, the invention is shown generally at 10 as applied to the rear side of a control box 11 which is attached to a condenser assembly 12. The condenser assembly 12 has at its periphery a coil 13 which surrounds a fan 14 as shown. The fan 14 is located near the top end of the coil 13 and is driven in the counterclockwise direction by a motor which is controlled by the control box 11. Also included within the condenser assembly 12 is a compressor (not shown) which is also controlled by the control box 11.

The control box 11 is mounted to the side of the condenser assembly 12 by way of a pair of rails 16 and 17, with each of the rails 16 and 17 being comprised of a top and bottom portions. The top and bottom portions of rail 17 are shown as 18 and 19, respectively in FIG. 3. The rail top portion 18 is attached to the condenser assembly side 21 by way of a fastener 22, and the rail bottom portion 19 is fastened to the condenser assembly wall 21 by way of fastener 23. The control box 11 is mounted to the rails 18 and 19 by fastner 24 and 26, respectively, and then the assembly is atttached to the condenser by fasteners 22 and 23 as shown in FIG. 3.

Formed in the rear side of the control box 11 is a rectangular opening 27 into which a heat sink 28 is disposed. A similar opening 30 is provided in the condenser assembly side 21 such that the heat sink 28, through the condenser coil, is directly exposed to the negative pressure area created by operation of the fan 14 within the condenser assembly 12. The heat sink 28 is located between and supported by the top and bottom rail portions 18 and 19. The inner side 29 of the heat sink 28 is substantially flush with the inner wall 31 of the control box 11 and has the electronic components 32 attached thereto in such a way that the components 32 give up their heat to the heat sink 28. On the rear side of the heat sink 28 is a plurality of vertically spaced, horizontally extending fins 33 that extend rearwardly toward the condenser assembly wall 21.

Operation of the fan 14 creates a negative pressure within the coil 13 to thereby cause the air to flow circumferentially from each side of the control box and then radially inwardly thru the coil 13, and through the opening 30, to be exhausted out by the fan 14. The flow of air in the vicinity of the control box 11 will therefore tend to flow in the directions indicated by the arrows. The applicants have thus discovered that by placing the fins 33 in the horizontal, short-axis disposition, the air flow, and hence the heat dissipation, is substantially increased from the design wherein the fins 33 are disposed in a vertical, long-axis disposition. This is primarily due to the shorter channel length, and therefore reduced pressure drop, as compared with the vertical fin design. Evidence of this fact can be seen by reference to Table 1 wherein the temperatures at the middle point of the control box 11 are compared for the designs wherein the heat sink is: (1) mounted on the side of the control box with the fins in a vertical disposition; (2) mounted on the rear of the control box with the fins in a vertical disposition; and (3) mounted on the rear of the control box 11 with the fins in the horizontal disposition.

TABLE I

|  | Temperatures, °F. | |
| --- | --- | --- |
|  | Ambient | Middle |
| Side Mounted, Vertical | 125.1 | 174.0 |
| Rear Mounted, Vertical | 124.9 | 175 2 |
| Rear Mounted, Horizontal | 124.7 | 148.9 |

As will be seen, the data was selected such that the ambient temperatures were substantially equal (i.e. nominally 125° F.). The power outputs of the three systems were also chosen to be substantially equal with the current at the inverter being nominally 13.5 amps. From the above data, it will be seen that the temperature at the middle of the heat sink is substantially lower for the rear mounted, horizontally disposed fins than for the two designs with the vertically aligned fins.

In addition to the evidence of lower temperatures at a critical location within the control box 11, the applicants test data also indicated that the heat sink with the horizontally disposed fins exhibited a substantially uniform air flow velocity over its surface than did the heat sink with the vertically disposed fins. It was found that the rear mounted, vertical finned heat sink exhibited a good air flow and heat dissipation characteristics at the top portion thereof, but that the air did not move to the middle portion of the heat sink before it flowed radially inwardly through the opening 30. Further, because of the restrictions at the lower portion of the control box, as will be seen by reference to the structures shown in U.S. patent Ser. No. 920,394, filed on Oct. 20, 1986 by Duell et al. herewith, assigned to the same assignee of the present invention, and incorporated herein by reference, the air flow from the bottom end of the vertically finned heat sink was not sufficient to provide the needed cooling effect.

Figure 4:
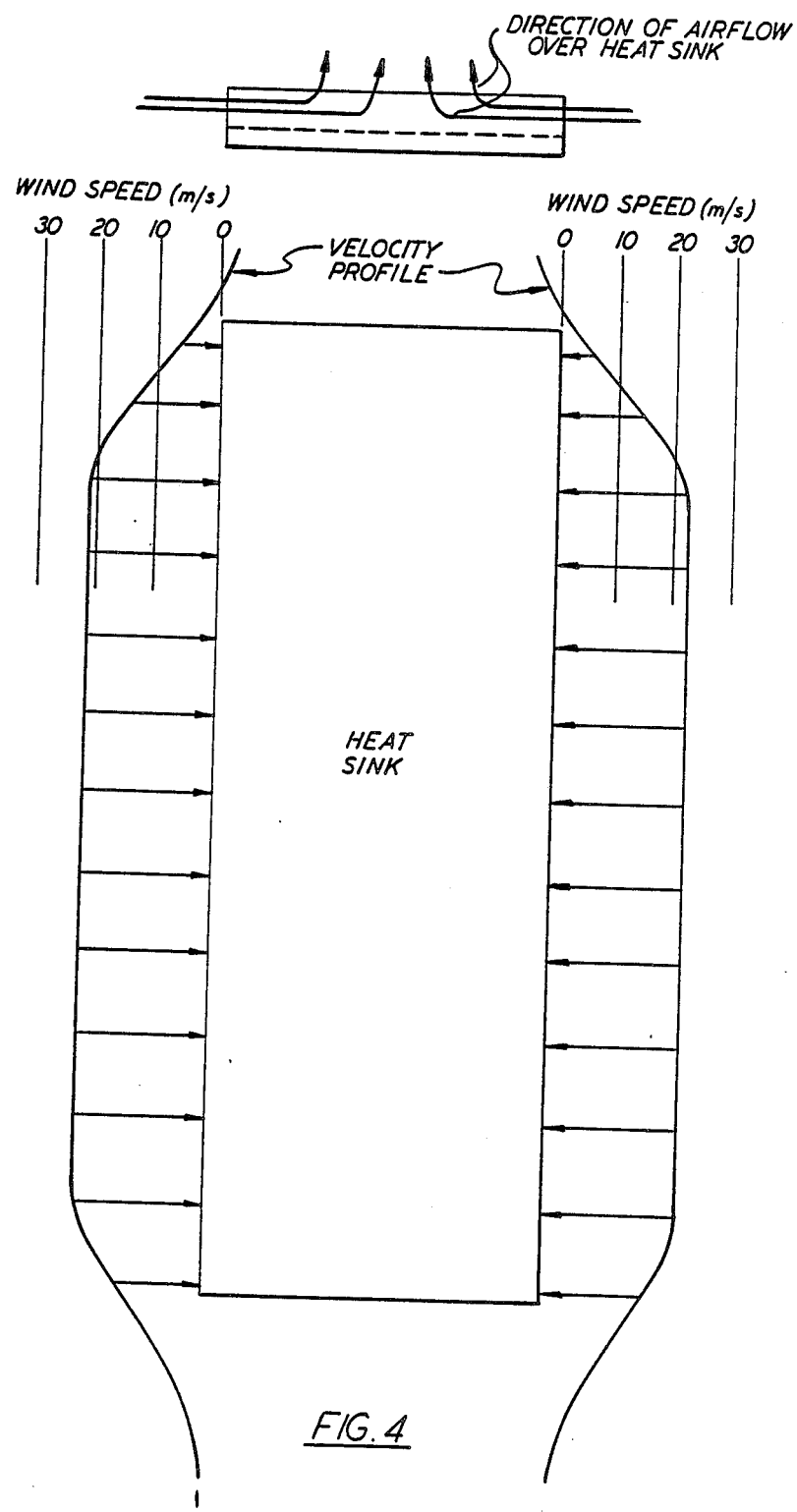
FIG. 4 is a velocity profile of the air flowing over a heat sink having horizontally aligned fins.

With the present invention, however, it was found that, because of the shorter length of the fins, and because of the unrestricted pathway on either side of the control box, the air flow was sufficient along the entire length of the fins to provide the needed cooling effect. The air flow velocity along the vertical axis was also found to be substantially uniform. This uniformity of air flow velocity can be seen by reference to FIG. 4 wherein the air flow velocity is shown as a function of vertical position along the edges of the heat sink. These measurements were taken with a Hastings Air Meter placed at positions of approximately 1″ from the heat sink edges. As will be seen, the velocity at the vertical midpoint of the heat sink is substantially the same as that at the top and bottom ends thereof. Further, because of the short length of the fins, as compared with that of the vertically aligned fins, the air flow to the mid point of the heat sink was found to be sufficient to provide the required cooling effect.

It should be understood that the present invention has been described in terms of a preferred embodiment but may take on any number of other forms or remaining within the scope an intent of the invention.

What is claimed is:

1. In an air conditioning system of the type having a heat exchanger coil structure with an internal fan for causing the cooling air to flow radially inwardly through a coil, an improved power module comprising:
   a control box containing electrical components for controlling the system, said control box being mounted to and supported by said outdoor coil structure; and
   a heat sink associated with said control box, said heat sink having said electrical components mounted thereon so as to give up their generated heat to said heat sink, and said heat sink further being located in the flow path of the cooling air, between said control box and said outdoor coil structure, such that a portion of cooling air passing thru said coil, first passes over said heat sink to thereby enhance the cooling thereof.

2. A power module as set forth in claim 1 wherein said heat sink has a plurality of fins formed thereon to further enhance the cooling thereof.

3. A power module is set forth in claim 2 wherein said fins are disposed in a generally horizontal disposition.

4. A control module as set forth in claim 2 wherein said heat sink is substantially larger in one dimension than the other and further wherein said fins extend across the shorter dimension.

5. In a box containing electrical components for controlling an air conditioning system of the type having a coil and a fan for drawing air inwardly thru the coil, an improved cooling arrangement comprising: a heat sink disposed between the box and the coil, said heat sink having its one side thermally connected to the electronic components to receive the heat therefrom, and having at its other side, a plurality of fins disposed in the flow path of the air flowing inwardly thru the coil to be cooled thereby.

6. A cooling arrangement is set forth in claim 5 wherein said heat sink's greater dimension is in the vertical direction and wherein said fins are aligned in the horizontal direction.

7. A cooling arrangement is set forth in claim 5 wherein said coil includes a surrounding louvered element and further wherein said louvered element has an opening formed therein at the location adjacent said heat sink.

* * * * *